United States Patent
Polvino et al.

(10) Patent No.: US 9,224,740 B1
(45) Date of Patent: Dec. 29, 2015

(54) HIGH-K DIELECTRIC STRUCTURE FOR DEEP TRENCH ISOLATION

(71) Applicant: International Business Machines Corporation, Armonk, NY (US)

(72) Inventors: Sean M. Polvino, Brooklyn, NY (US); Shahab Siddiqui, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/566,929

(22) Filed: Dec. 11, 2014

(51) Int. Cl.
| | |
|---|---|
| *H01L 21/8242* | (2006.01) |
| *H01L 27/108* | (2006.01) |
| *H01L 29/66* | (2006.01) |

(52) U.S. Cl.
CPC .... *H01L 27/10861* (2013.01); *H01L 27/10879* (2013.01); *H01L 27/1082* (2013.01); *H01L 27/10826* (2013.01); *H01L 27/10838* (2013.01); *H01L 27/10858* (2013.01); *H01L 29/66181* (2013.01); *H01L 2924/1436* (2013.01)

(58) Field of Classification Search
CPC ............... H01L 29/66181; H01L 27/10861; H01L 27/10829; H01L 2924/1436; H01L 27/10879; H01L 27/1082; H01L 27/10832; H01L 27/10826; H01L 27/10838
USPC .......................... 438/386, 778, 785, 241, 239
See application file for complete search history.

(56) References Cited

U.S. PATENT DOCUMENTS

| | | | |
|---|---|---|---|
| 6,657,276 B1 | 12/2003 | Karlsson et al. | |
| 6,984,569 B2 | 1/2006 | Karlsson et al. | |
| 8,278,182 B2 | 10/2012 | Mouli | |
| 8,492,820 B2 | 7/2013 | Anderson et al. | |
| 8,652,888 B2 | 2/2014 | Cheng et al. | |
| 8,722,494 B1 | 5/2014 | Basker et al. | |
| 2005/0145913 A1* | 7/2005 | Katsumata | H01L 27/1087 257/301 |
| 2012/0187523 A1 | 7/2012 | Cummings et al. | |
| 2012/0196424 A1 | 8/2012 | Krishnan et al. | |
| 2012/0261792 A1 | 10/2012 | Cheng et al. | |
| 2013/0092992 A1* | 4/2013 | Chang | H01L 27/10823 257/301 |
| 2013/0309835 A1* | 11/2013 | Basker | H01L 27/0629 438/389 |
| 2014/0070294 A1 | 3/2014 | Faltermeier et al. | |

* cited by examiner

*Primary Examiner* — Ha Tran T Nguyen
*Assistant Examiner* — Aaron Dehne
(74) *Attorney, Agent, or Firm* — Law Offices of Ira D. Blecker, P.C.

(57) ABSTRACT

A method of deep trench isolation which includes: forming a semiconductor on insulator (SOI) substrate comprising a bulk semiconductor substrate, a buried insulator layer and a semiconductor layer on the buried insulator layer (SOI layer), one portion of the SOI substrate having a dynamic random access memory buried in the bulk semiconductor substrate (eDRAM) and a deep trench fin contacting the eDRAM and a second portion of the SOI substrate having an SOI fin in contact with the buried insulator layer; conformally depositing sequential layers of oxide, high-k dielectric material and sacrificial oxide on the deep trench fin and the SOI fin; stripping the sacrificial oxide over the SOI fin to expose the high-k dielectric material over the SOI fin; stripping the exposed high-k dielectric material over the SOI fin to expose the oxide layer over the SOI fin.

10 Claims, 6 Drawing Sheets

HIGH-K DIELECTRIC STRUCTURE FOR DEEP TRENCH ISOLATION

BACKGROUND

The present exemplary embodiments generally relate to semiconductor devices and the fabrication thereof, and more particularly, relate to an insulative structure over a deep trench fin to provide insulation from the passing wordline.

Semiconductors and integrated circuit chips have become ubiquitous within many products due to their continually decreasing cost and size. In the microelectronics industry as well as in other industries involving construction of microscopic structures (such as micromachines, magnetoresistive heads, etc.) there is a continued desire to reduce the size of structural features and microelectronic devices and/or to provide a greater amount of circuitry for a given chip size. Miniaturization, in general, allows for increased performance (more processing per clock cycle and less heat generated) at lower power levels and lower cost. Present technology is at or approaching atomic level scaling of certain micro-devices such as logic gates, field effect transistors (FETs), and capacitors. Circuit chips with hundreds of millions of such devices are not uncommon. Further size reductions appear to be approaching the physical limit of trace lines and micro-devices that are embedded upon and within their semiconductor substrates.

It is common practice to integrate memory and logic functions on a common semiconductor substrate. In such a configuration, when the memory function is performed by a dynamic random access memory (DRAM) cell, the circuitry is referred to as embedded DRAM (eDRAM). The logic function may be performed by a nonplanar device such as a FinFET. A FinFET is a double-gate structure that exhibits good short channel behavior. A FinFET includes a channel formed in a vertical fin.

BRIEF SUMMARY

The various advantages and purposes of the exemplary embodiments as described above and hereafter are achieved by providing, according to a first aspect of the exemplary embodiments, a method of deep trench isolation which includes: forming a semiconductor on insulator (SOI) substrate comprising a bulk semiconductor substrate, a buried insulator layer and a semiconductor layer on the buried insulator layer (SOI layer), one portion of the SOI substrate having a dynamic random access memory buried in the bulk semiconductor substrate (eDRAM) and a deep trench fin contacting the eDRAM and a second portion of the SOI substrate having an SOI fin in contact with the buried insulator layer; conformally depositing a layer of oxide on the deep trench fin and the SOI fin; conformally depositing a layer of high-k dielectric material on the oxide; conformally depositing a sacrificial oxide on the high-k dielectric material; stripping the sacrificial oxide over the SOI fin to expose the high-k dielectric material over the SOI fin while avoiding stripping the sacrificial oxide over the deep trench fin contacting the eDRAM; and stripping the exposed high-k dielectric material over the SOI fin to expose the oxide layer over the SOI fin.

According to a second aspect of the exemplary embodiments, there is provided a deep trench isolation which includes: a semiconductor on insulator (SOI) substrate comprising a bulk semiconductor substrate, a buried insulator layer and a semiconductor layer on the buried insulator layer (SOI layer); a first portion of the SOI substrate having a dynamic random access memory buried in the bulk semiconductor substrate (eDRAM) and a deep trench fin contacting the eDRAM, the deep trench fin having a first layer of oxide in contact with the deep trench fin, a high-k material in contact with the first layer of oxide and a capping layer in contact with the high-k material; and a second portion of the SOI substrate having an SOI fin in contact with the buried insulator layer, the SOI fin having the capping layer in contact with the SOI fin and being devoid of the high-k material.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 12 illustrate a process for forming a deep trench isolation of the exemplary embodiments wherein:

FIG. 1 is a cross sectional view that illustrates a patterning process to form an opening to form the deep trench eDRAM.

FIG. 2 is a cross sectional view that illustrates a patterning process in which the opening in FIG. 1 is filled;

FIG. 3 is a cross sectional view that illustrates a patterning process for the forming of the eDRAM fin and the FinFET fin.

FIG. 4 is a top view that illustrates the eDRAM fin on the deeptrench eDRAM and the FinFET fin.

FIG. 5 is a cross sectional view that illustrates the deposition of sequential layers of oxide, high-k material and sacrificial oxide over the eDRAM fin and the FinFET fin.

FIG. 6 is a cross sectional view that illustrates the forming of a mask material over the SOI substrate.

FIG. 7 is a cross sectional view that illustrates the patterning of the mask material to expose the FinFET fin.

FIG. 8 is a cross sectional view that illustrates the stripping of the sacrificial oxide layer from the FinFET fin.

FIG. 9 is a cross sectional view that illustrates the stripping of the high-k layer from the FinFET fin.

FIG. 10 is a cross sectional view that illustrates the stripping of the mask material from the SOI substrate.

FIG. 11 is a cross sectional view that illustrates the stripping of the sacrificial oxide from the eDRAM fin and the oxide layer from the FinFET fin.

FIG. 12 is a cross sectional view that illustrates the depositing of a last oxide layer over the eDRAM fin and the FinFET fin.

DETAILED DESCRIPTION

The exemplary embodiments recite a fin contact with the eDRAM. The fin contact for the eDRAM needs to be insulated from interference from the crossing word line. An oxide may be deposited to isolate the tops of the deep trench and fin contact of the eDRAM from interference from the word line. Further, in FinFET based technologies, it is necessary to deposit this oxide insulation layer in order to achieve conformity. The use of the oxide alone may cause fin erosion and degrade device performance.

The present inventors have proposed that instead of using more traditional dielectrics such as $SiO_2$ and $Si_3N_4$ as the insulation layer, it is proposed to use a stack including a high-k dielectric layer. High-k dielectric materials for the high-k dielectric layer may include any high-k dielectric material having a dielectric constant greater than about 7. Preferred high-k materials may include materials such as, but not limited to, $HfO_2$ (hafnium oxide), HfSiO (hafnium silicon oxide), $TiO_2$ (titanium oxide), $La_2O_3$ (lanthanum oxide), $Al_2O_3$ (aluminum oxide). The high-k materials have a different wet and/or reactive ion etch (RIE) etch chemistry allowing for easier selectivity and patterning while simultaneously having good insulating behavior.

Figure 1:
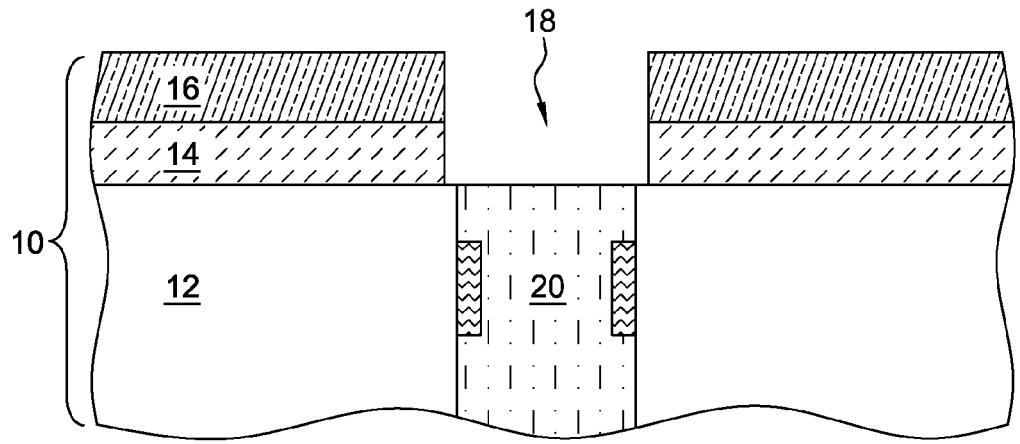

Referring to the Figures in more detail, and particularly referring to FIG. 1, there is shown a semiconductor on insulator (SOI) substrate 10 having a semiconductor base 12 (usually silicon), a buried insulator layer 14 (usually an oxide) and a semiconductor on insulator (SOI) layer 16. SOI layer 16 is usually silicon but could also be any other semiconductor material.

In alternative embodiments, semiconductor base 12 and/or SOI layer 16 may comprise other semiconducting materials, including but not limited to group IV semiconductors such as silicon, silicon germanium or germanium, a III-V compound semiconductor, or a II-VI compound semiconductor. Buried insulator layer 14 may comprise other dielectric materials besides an oxide. When buried insulator layer 14 consists of an oxide, it may be referred to as a buried oxide layer or BOX layer.

The SOI layer 16 and buried insulator layer 14 have been conventionally patterned to form an opening 18. Deep trench DRAM 20 has been conventionally formed in the semiconductor base 12. Deep trench DRAM 20 has been shown schematically as it is expected that the exemplary embodiments may have applicability to any structure in which there is a deep trench DRAM of any time. Deep trench DRAM 20 in the SOI substrate 10 is hereafter referred to as eDRAM 20.

Figure 2:
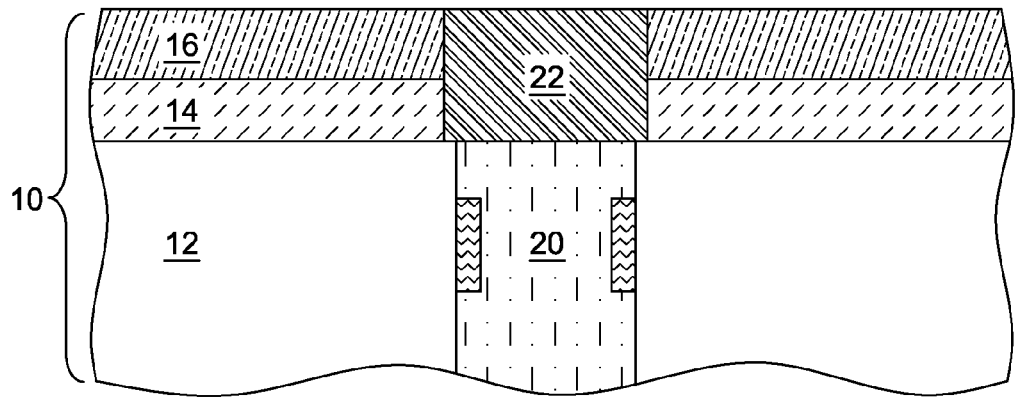

Referring to FIG. 2, processing continues by filling in the opening 18 with a material 22 such as polysilicon so that the material 22 is at the same height as the SOI layer 16.

Figure 3:
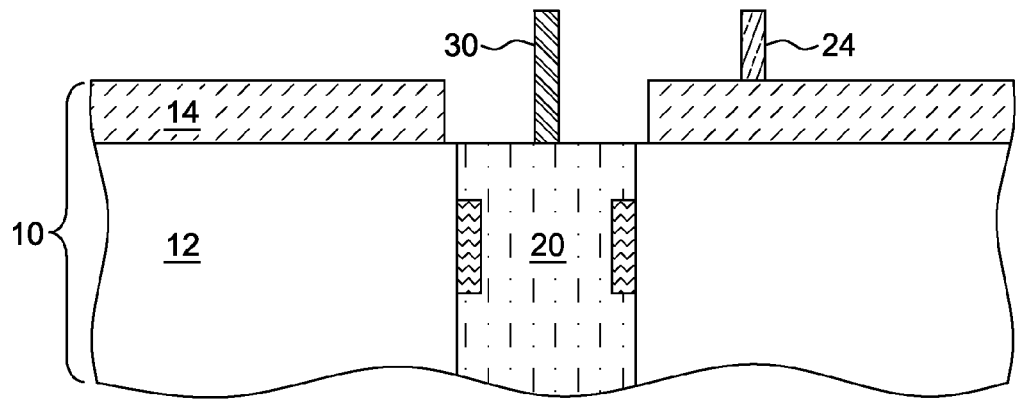

Referring now to FIG. 3, the SOI layer 16 and material 22 may be simultaneously patterned to form FinFET fin 24 and eDRAM fin 30, respectively. FinFET fin 24 will form part of the FinFET that is to be subsequently formed. Even though SOI layer 16 is not shown in FIG. 3, the SOI substrate may still be represented by reference number 10 as there is SOI layer 16 elsewhere on the SOI substrate 10.

Figure 4:
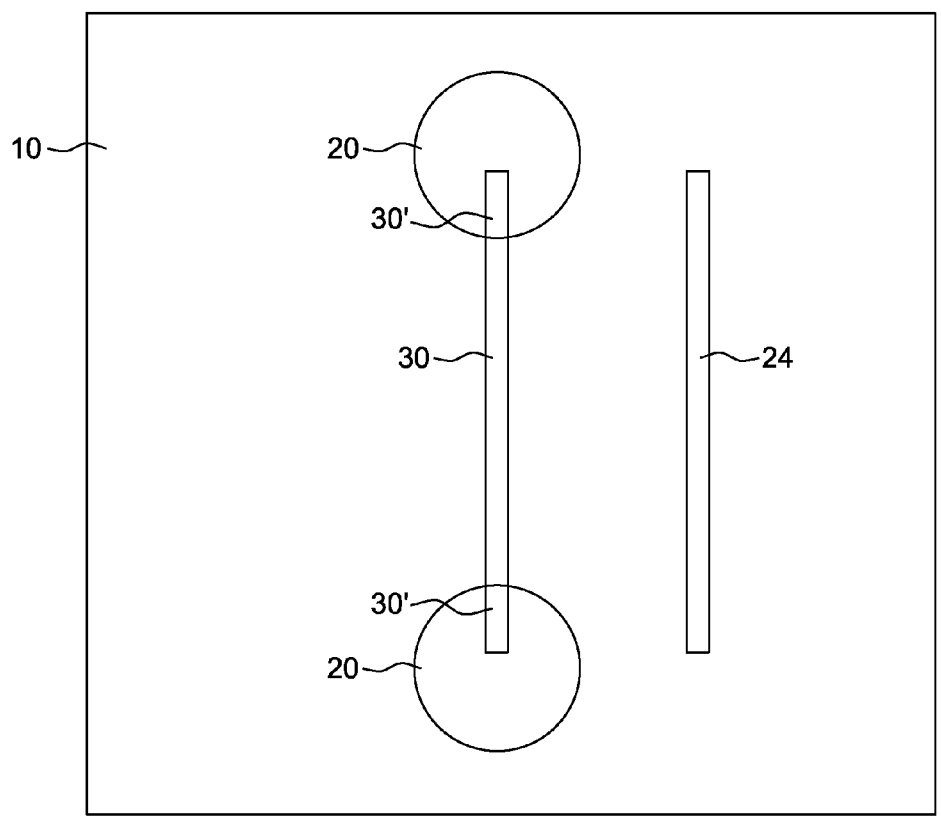

A top view of the structure shown in FIG. 3 is now shown in FIG. 4. The eDRAM fin 30 may extend to connect two eDRAMs 20. It is noted that only a portion of eDRAM fin 30 is in direct contact with eDRAM 20. The portion of eDRAM fin 30 that is in direct contact with eDRAM 20 is referred to hereafter as eDRAM fin portion 30'. In a most preferred embodiment, it is only eDRAM fin portion 30' that is insulated from interference from the crossing word line. However, it should be understood that a portion of eDRAM fin 30 that is in close proximity to eDRAM 20 may also be insulated. As shown in FIG. 3 (and later in FIG. 13), the eDRAM fin 30 not in contact with eDRAM 20 as well as FinFET fin 24 are in contact with the buried insulator layer 14 of SOI substrate 10.

Figure 5:
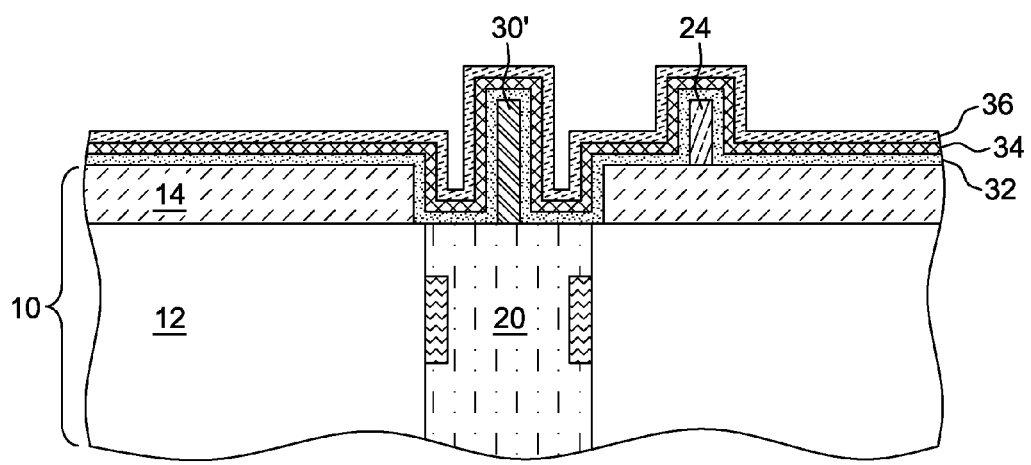

Referring now to FIG. 5, the process continues by preferably conformally depositing sequential layers of oxide 32, high-k material 34 and a sacrificial layer 36, such as an oxide over the SOI substrate 10 including over the eDRAM fin 30 and the FinFET fin 24. The thickness of each of the oxide 32, high-k material and sacrificial oxide layer 36 is about 10 to 40 angstroms. The high-k material 34 may be any high-k material having a dielectric constant greater than about 7 and preferably may be, for example, $HfO_2$ (hafnium oxide), HfSiO (hafnium silicon oxide), $TiO_2$ (titanium oxide), $La_2O_3$ (lanthanum oxide), $Al_2O_3$ (aluminum oxide), $ZrO_2$ (zirconium oxide), $Ta_2O_5$ tantalum oxide), and other like oxides including perovskite-type oxides.

The part of the eDRAM fin 30 that is shown in the remaining cross sectional views is eDRAM fin portion 30'. The eDRAM fin 30 that is not in contact with the eDRAM 20 may be processed in the same manner as FinFET fin 24.

Figure 6:
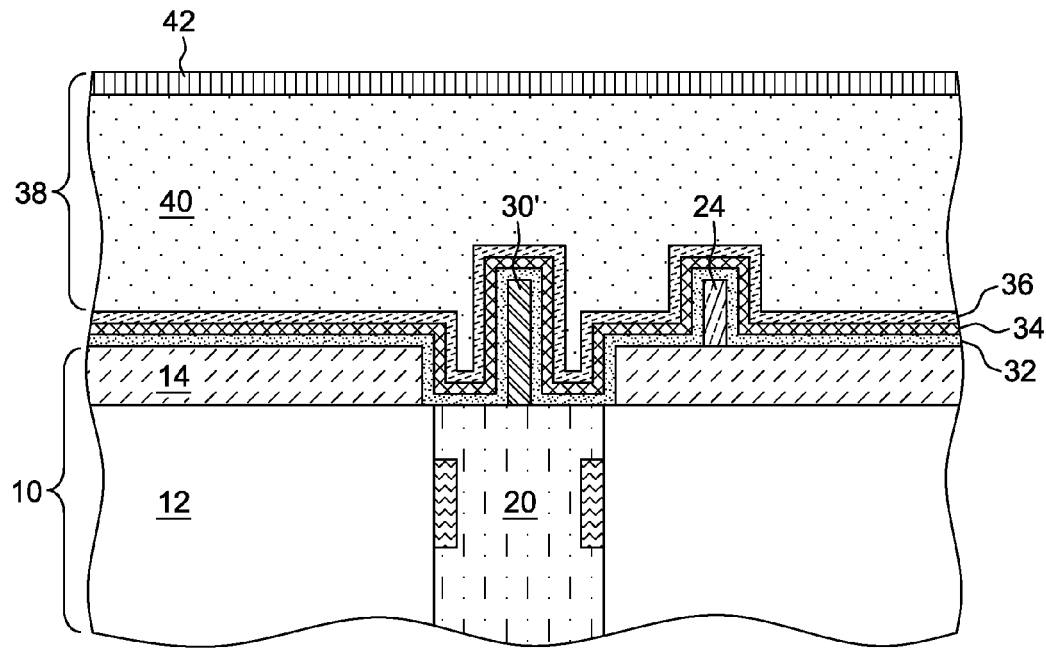

FIG. 6 illustrates the forming of a mask material 38 over the SOI substrate 10 including over oxide layer 32, high-k layer 34 and sacrificial oxide layer 36. Mask material 38 is conventional and may include, for example, an optical planarization layer 40 and a photoresist 42.

Figure 7:
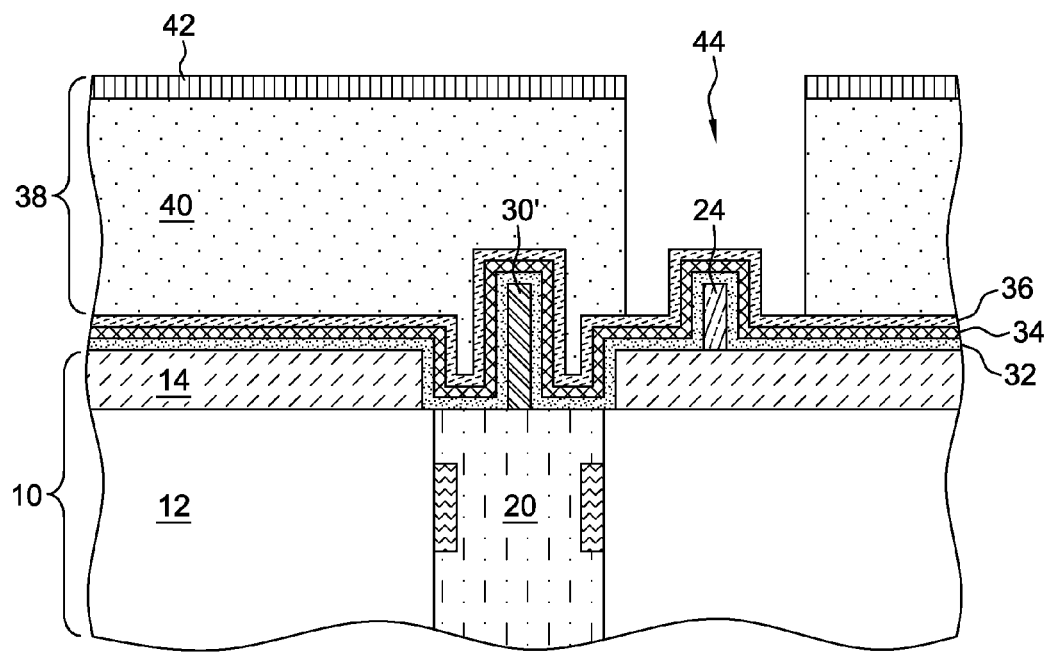

The mask material 38 may be conventionally patterned by, for example, a RIE process to form an opening 44 so as to expose the oxide layer 32, high-k layer and sacrificial oxide layer 36 over FinFET fin 24 as shown in FIG. 7.

Figure 8:
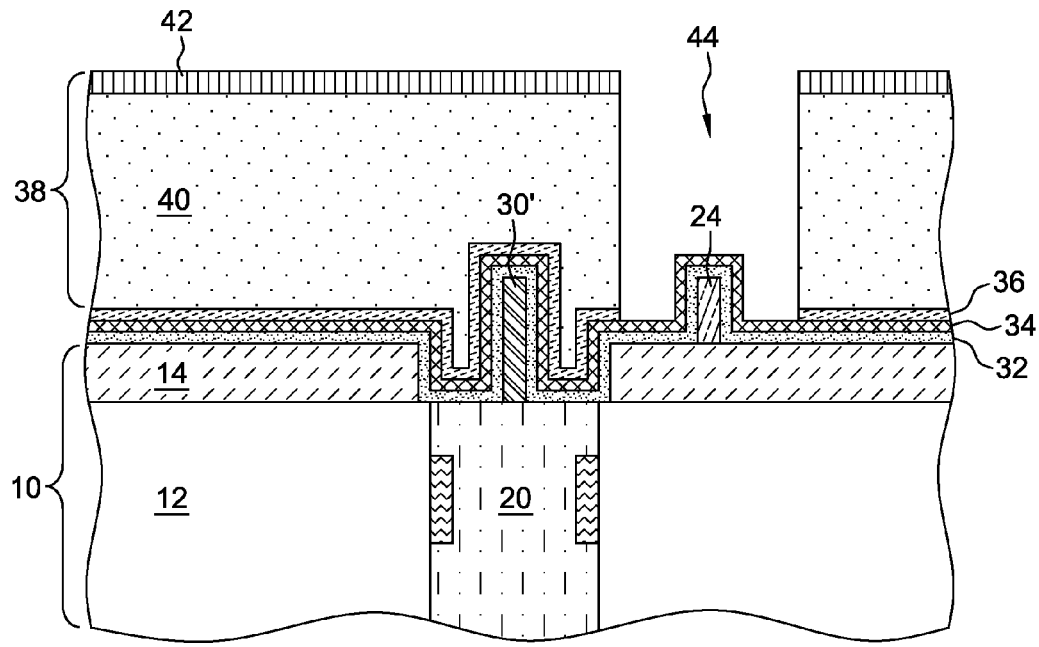

FIG. 8 illustrates the stripping of the sacrificial oxide layer 36 exposed through opening 44 by an etching process. The etching process may be by a wet etching process or a dry etching process. An example of a wet etching process may be dilute hydrofluoric acid (DHF) and a dry etching process may be RIE. The presence of the underlying high-k layer 34 allows good etch selectivity so that the sacrificial oxide layer 36 may be removed without unduly etching the high-k layer 34.

Figure 9:
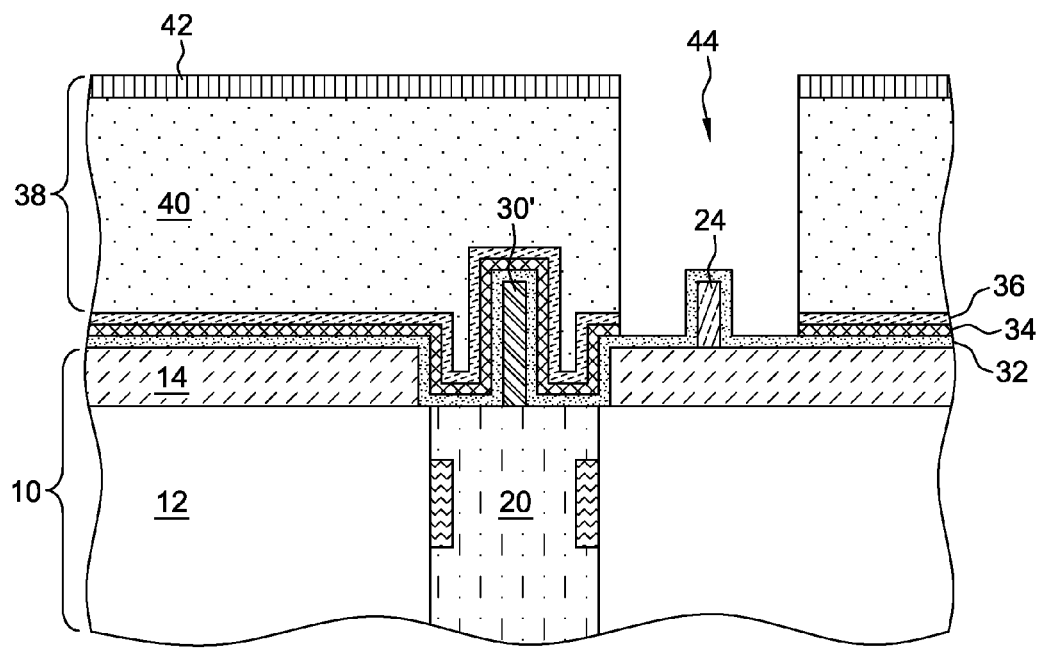

FIG. 9 illustrates the stripping of the high-k layer 34 from the FinFET fin 24. The etching process used is selective to the high-k layer 34 so that the underlying oxide layer 32 is only minimally affected by the etching of the high-k layer 34. FinFET fin 24 is shown with only oxide layer 32. Preferably, the high-k layer 34 may be stripped using an etching agent that will not affect, or at least minimally affect, the underlying oxide layer 32. Such an etching agent may be a non-HF material such as hydrochloric acid (HCl) or SC1 (a solution of deionized water, ammonium hydroxide and hydrogen peroxide).

Figure 10:
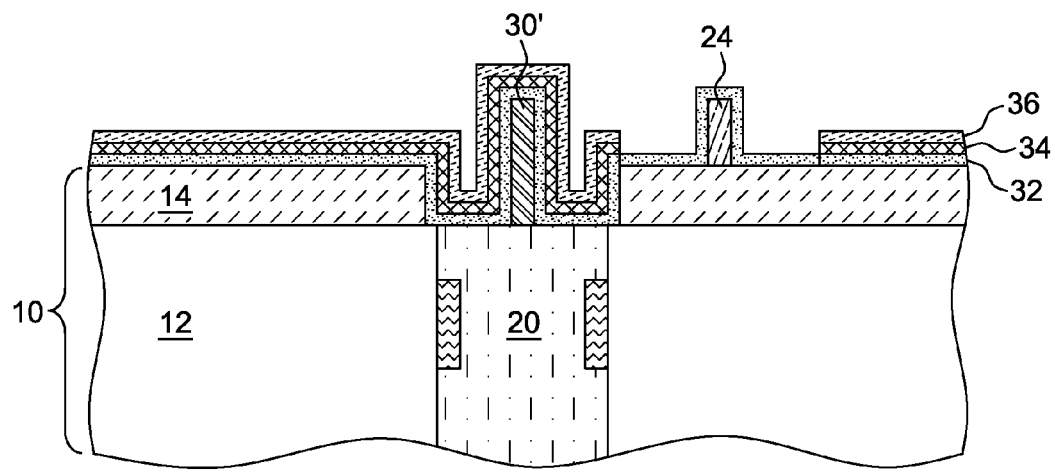

The mask material 38 may then be conventionally stripped to result in the structure shown in FIG. 10.

Figure 11:
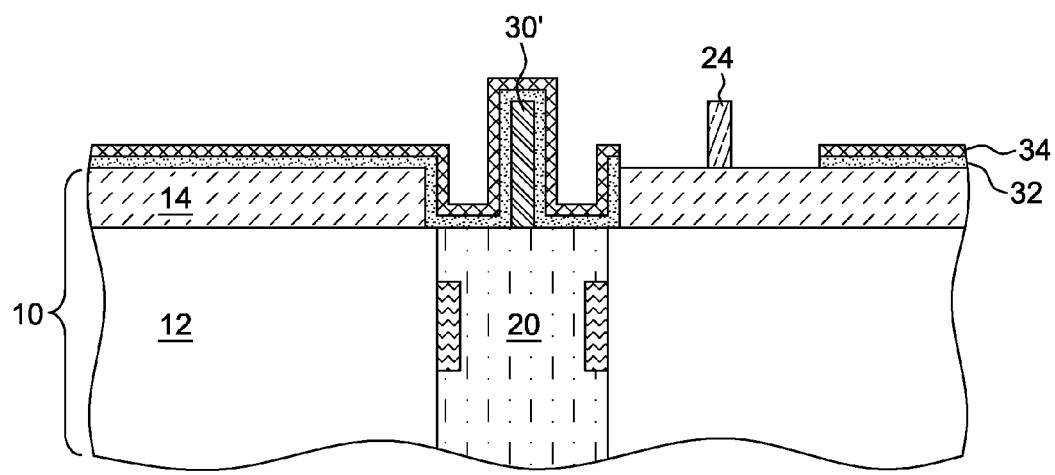

Thereafter, processing continues by removing the sacrificial oxide 36 from the areas previously covered by the masking material 38 and removing the oxide layer 32 from over the FinFET fin 24 that was exposed through opening 44 in mask material 38. The sacrificial oxide 36 and oxide layer 32 may be removed by any process selective to oxide including wet etching by HF or RIE. After removal of the sacrificial oxide 36 and oxide layer 32, the structure appears as shown in FIG. 11.

Figure 12:
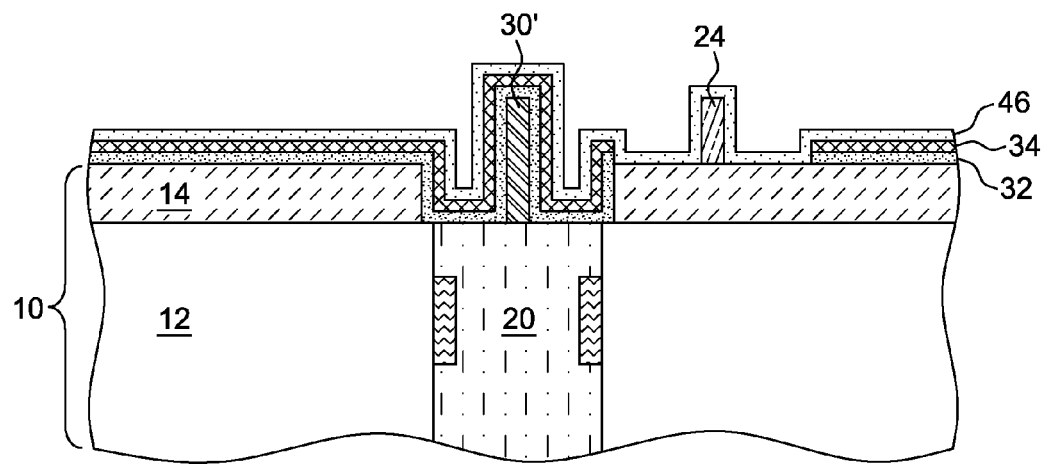

In the next step of the process, a capping layer 46, such as oxide is preferably conformally deposited to a thickness of about 10 to 50 angstroms. The resulting structure is shown in FIG. 12. The capping oxide layer 46 is done in order to insure that the final oxide that is put down is not damaged by the patterning processes in order to result in the cleanest interface and highest quality oxide so this can be utilized in future as a gate oxide.

Alternatively, in an additional embodiment the steps of removing the oxide layer 32 followed by depositing the capping oxide layer 46 may be omitted and the initial oxide layer 32 left following the patterning layer strip.

Figure 13:
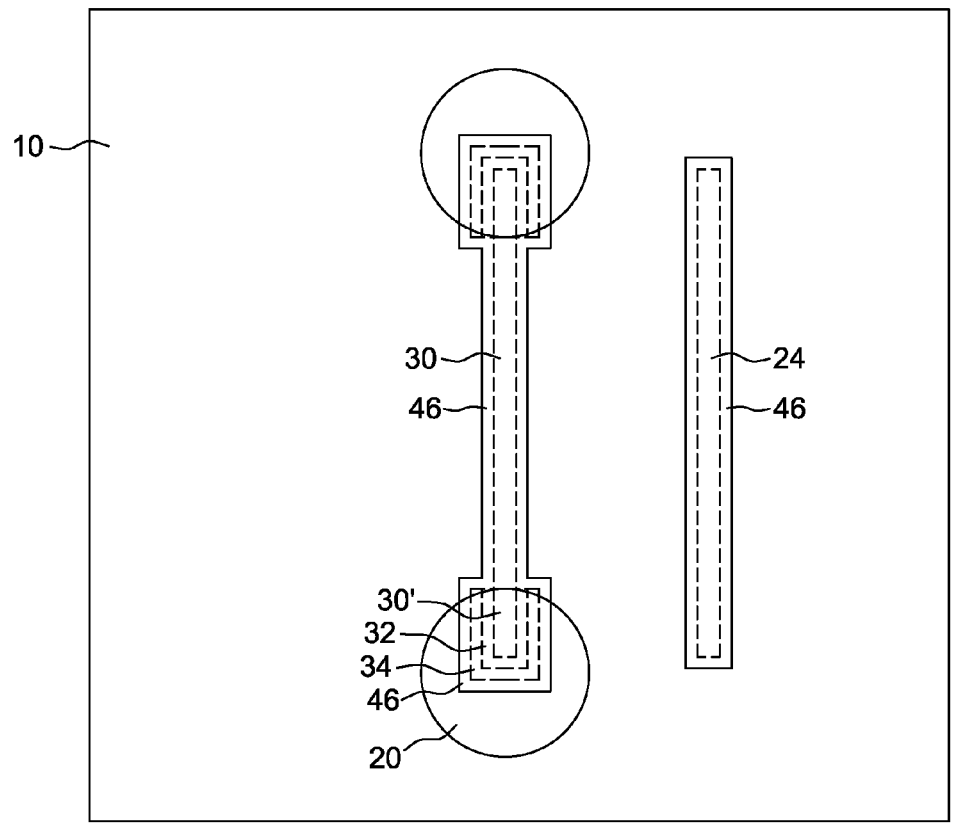
FIG. 13 is a top view of the structure of FIG. 12.

Thereafter, the structure in FIG. 12 may undergo further processing to build the gates for the eDRAM fin 30 and the FinFET fin 24 as well as sources and drains. All of the different types of devices whether they are SRAM, logic, or eDRAM may be connected in some way through metal wiring, etc, in the further processing A top view of the final structure is shown in FIG. 13 in which the oxide layer 32 and high-k layer 34 are only present on the eDRAM fin portion 30'. The oxide layer 32 and high-k layer 34 preferably should extend just beyond the boundary of eDRAM 20.

In a further alternative embodiment, the high-k layer 34 after deposition may be doped to vary its etch selectivity. For example, the high-k material 34 may be doped with lanthanum (La), aluminum (Al) or nitrogen. The concentration of the dopant may be from about 5 to 30 atomic %, and the doping may be done either via in-situ doping during deposition or by post deposition implant. After doping, the structure may be annealed in a temperature range from 600 to 1000° C. with higher annealing temperatures leading to higher etch selectivity of the high-k material.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of deep trench isolation comprising:
   forming a semiconductor on insulator (SOI) substrate comprising a bulk semiconductor substrate, a buried insulator layer and a semiconductor layer on the buried insulator layer (SOI layer), one portion of the SOI substrate having a dynamic random access memory buried in the bulk semiconductor substrate (eDRAM) and a deep trench fin contacting the eDRAM and a second portion of the SOI substrate having an SOI fin in contact with the buried insulator layer;
   conformally depositing a layer of oxide on the deep trench fin and the SOI fin;
   conformally depositing a layer of high-k dielectric material on the oxide;
   conformally depositing a sacrificial oxide on the high-k dielectric material;
   stripping the sacrificial oxide over the SOI fin to expose the high-k dielectric material over the SOI fin while avoiding stripping the sacrificial oxide over the deep trench fin contacting the eDRAM; and
   stripping the exposed high-k dielectric material over the SOI fin to expose the oxide layer over the SOI fin.

2. The method of claim 1 further comprising, after the step of stripping the exposed high-k dielectric material:
   stripping the sacrificial oxide over the deep trench fin while also stripping the oxide layer over the SOI fin;
   depositing a capping layer over the deep trench fin and over the SOI fin.

3. The method of claim 2 wherein the capping layer is an oxide.

4. The method of claim 1 wherein the high-k dielectric material has a dielectric constant greater than 7.

5. The method of claim 1 wherein the high-k material is selected from the group consisting of HfO2 (hafnium oxide), HfSiO (hafnium silicon oxide), TiO2 (titanium oxide), La2O3 (lanthanum oxide) and Al2O3 (aluminum oxide) ZrO2 (zirconium oxide), Ta2O5 tantalum oxide), and other like oxides including perovskite-type oxides.

6. The method of claim 1 wherein the high-k material is doped by the addition of a dopant material to the high-k material.

7. The method of claim 6 wherein the dopant material is selected from the group consisting of lanthanum, aluminum and nitrogen.

8. The method of claim 1 wherein the deep trench fin is in direct contact with the eDRAM.

9. The method of claim 1 wherein the deep trench fin has a first portion in contact with the eDRAM and a second portion not in contact with the eDRAM such that the second portion of the deep trench fin is substantially devoid of the high-k material.

10. The method of claim 8 wherein only the first portion of the deep trench fin is in direct contact with the eDRAM.

* * * * *